United States Patent
Holland et al.

(10) Patent No.: US 7,921,237 B1
(45) Date of Patent: Apr. 5, 2011

(54) PRESERVING DATA INTEGRITY OF DMA DESCRIPTORS

(75) Inventors: Thomas Holland, Mountain View, CA (US); William McGovern, San Jose, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 294 days.

(21) Appl. No.: 12/330,450

(22) Filed: Dec. 8, 2008

Related U.S. Application Data

(60) Provisional application No. 61/100,964, filed on Sep. 29, 2008.

(51) Int. Cl.
G06F 13/28 (2006.01)
G06F 11/00 (2006.01)
H03M 13/00 (2006.01)

(52) U.S. Cl. ............. 710/22; 710/23; 710/27; 710/28; 714/100; 714/758

(58) Field of Classification Search .................. None
See application file for complete search history.

(56) References Cited

U.S. PATENT DOCUMENTS

| | | | |
|---|---|---|---|
| 6,105,160 A * | 8/2000 | Fukumoto et al. | 714/776 |
| 2005/0289253 A1 * | 12/2005 | Edirisooriya et al. | 710/22 |
| 2008/0040519 A1 * | 2/2008 | Starr et al. | 710/39 |

* cited by examiner

*Primary Examiner* — Alan Chen
(74) *Attorney, Agent, or Firm* — Blakely, Sokoloff, Taylor & Zafman LLP

(57) ABSTRACT

A storage system includes a host computer coupled to a device to transfer a DMA descriptor between the host and the device. An integrity manager manages the integrity of the DMA descriptor between the host computer and the device. The integrity manager embeds a host-side DMA descriptor integrity value in the DMA descriptor and the device transfers the DMA descriptor to a device memory. The device generates a device-side DMA descriptor integrity value and compares it to the host-side DMA descriptor integrity value to determine if the descriptor is corrupted.

16 Claims, 8 Drawing Sheets

PRESERVING DATA INTEGRITY OF DMA DESCRIPTORS

This application claims the benefit of U.S. Provisional Application No. 61/100,964, filed Sep. 29, 2008.

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright© 2007, NetApp, Inc., All Rights Reserved.

FIELD OF THE INVENTION

This invention relates generally to electronic data storage, and more particularly to Direct Memory Access (DMA).

BACKGROUND

A Direct Memory Access (DMA) subsystem is a common component in modern computers. The DMA subsystem allows a device or process in a host system to transfer data from a source location to a destination location without creating a significant load on the host's Central Processing Unit (CPU). Without the DMA subsystem, the CPU would have to perform each operation involved in copying the data from one place to another, generally over a bus. Transfers over a bus tend to be slower than transfers using normal system RAM. Without the DMA subsystem, the CPU would be unavailable for other computational and control tasks for the duration of the transfer. With the DMA subsystem, the CPU initiates the transfer, and the DMA subsystem performs the actual copying of the data, leaving the CPU available for other computational and control tasks.

A DMA subsystem may be implemented as a DMA device coupled to a bus which is also coupled to a host. For example, an expansion card, such as a PCI Express card, may implement a DMA subsystem. A client device generates a DMA request identifying a region of host memory as the source location and a region of DMA memory as a destination location, or other source or destination location, such as another device. Software running on the host generates a DMA descriptor in response to the DMA request, stores the descriptor in host memory, and signals the DMA subsystem that a new descriptor is pending. The DMA subsystem transfers the descriptor from host memory to a working memory of the DMA subsystem and performs the request specified by the descriptor.

A DMA descriptor is a data structure stored in memory. The descriptor specifies the parameters of a DMA request. While stored in the host memory and waiting for the DMA subsystem, an error may corrupt the descriptor. In addition, when the DMA subsystem transfers the descriptor over the bus and into the working memory, a transit error may corrupt the descriptor. If any of these events occurs, there is a potential for further damage to data stored in the memory of the host or elsewhere. For example, a corrupted descriptor may instruct the DMA subsystem to copy the wrong data to the wrong place. The resulting state of the memory as modified by the DMA subsystem does not match the DMA request and may be detrimental to the host or client device.

SUMMARY

A storage system includes a host computer coupled to a device to transfer a DMA descriptor between the host and the device. An integrity manager manages the integrity of the DMA descriptor between the host computer and the device. The integrity manager embeds a host-side DMA descriptor integrity value in the DMA descriptor and the device transfers the DMA descriptor to a device memory. The device generates a device-side DMA descriptor integrity value and compares it to the host-side DMA descriptor integrity value to determine if the descriptor is corrupted.

The present invention is described in conjunction with systems, clients, servers, methods, and computer-readable media of varying scope. In addition to the aspects of the present invention described in this summary, further aspects of the invention will become apparent by reference to the drawings and by reading the detailed description that follows.

DETAILED DESCRIPTION

Figure 1A:
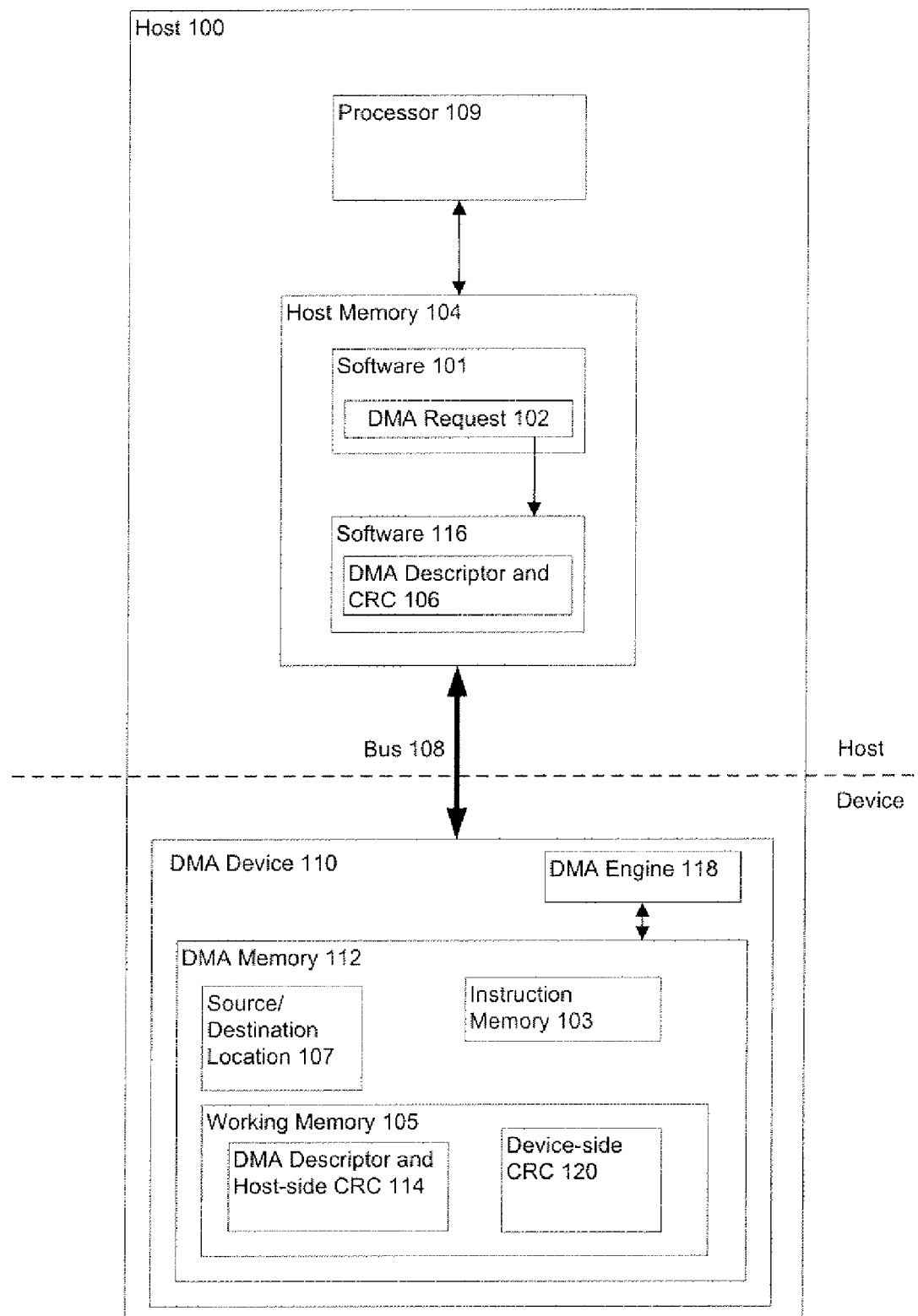
FIG. 1A is a diagram illustrating a system-level overview of an embodiment of the invention operating within a data processing system.

In the following detailed description of embodiments of the invention, reference is made to the accompanying drawings in which like references indicate similar elements, and in which is shown by way of illustration specific embodiments in which the invention may be practiced. These embodiments are described in sufficient detail to enable those skilled in the art to practice the invention, and it is to be understood that other embodiments may be utilized and that logical, mechanical, electrical, functional, and other changes may be made without departing from the scope of the present invention. The following detailed description is, therefore, not to be taken in a limiting sense, and the scope of the present invention is defined only by the appended claims.

End-to-end integrity protection of a DMA (direct memory access) descriptor as it is transmitted between a host and a device in a storage system is provided through the use of an embedded DMA integrity value. The DMA integrity value identifies the contents of the DMA descriptor prior to be transmitted. An integrity value identifies the contents of the DMA descriptor at the time the integrity value is created. If a subsequent integrity value is created based on the contents of the DMA descriptor, and those contents have changed, the subsequent integrity value will not match the original, since the subsequent integrity value identifies a DMA descriptor with different (e.g., corrupted) contents. When the DMA descriptor reaches its destination, the embedded DMA integrity value is compared to an integrity value generated by the receiver. If the values match, the DMA descriptor arrived intact, otherwise, the descriptor was corrupted during transmission. End-to-end refers to the integrity of the DMA descriptor from creation on the host to receipt on the device, or vice versa.

A system level overview of the operation of an embodiment of the invention is described by reference to FIG. 1A. Host 100 includes processor 109, host memory 104, bus 108, and DMA device 110. Processor 109 executes instructions from host memory 104, including instructions defining software 101 and software 116. While executing on processor 109, software 101 generates DMA request 102, which is sent to host-side integrity software 116. Software 116 generates DMA descriptor and Cyclic Redundancy Check (CRC) 106 in response to receiving request 102. A DMA descriptor may comprise instructions to the DMA device about a source location and size of data to be copied and a destination location for the data. The descriptor may store other data (e.g., an integrity value) as well. A CRC is a type of function (or output of such a function) that takes an arbitrary amount of data as input and generates an output value identifying the input data. If the input data changes (e.g., corrupted during transmission) a subsequent CRC created from the transmitted data will very likely not match the original CRC (i.e., an error is detected). Descriptors and CRCs are described in greater detail below in conjunction with FIGS. 3A and 3B. Host memory 104 is coupled to DMA device 110 through bus 108. Those skilled in the art will appreciate that bus 108 may be a system bus, a network (LAN, WAN, etc.) or other communications channel between the host component and the device component.

Software 116 sends a signal to DMA engine 118 when DMA descriptor and CRC 106 are available. DMA Device 110 includes DMA engine 118 and DMA memory 112. DMA memory 112 includes a source or destination location 107, an instruction memory 103, and a working memory 105. When host 100 powers on DMA device 110, instruction memory 103 configures DMA engine 118 with instructions. When the configured DMA engine 118 receives the signal from software 116, engine 118 transfers DMA descriptor and CRC 106 from host memory 104 to working memory 105 through bus 108. Engine 118 computes a device-side CRC 120 and stores it in working memory 105. If engine 118 determines that the host-side and device-side CRC values match, the transfer of descriptor 106 was successful and engine 118 performs the DMA request 102 specified by DMA descriptor 114. Otherwise, engine 118 does not perform the DMA request 102 and signals software 116 of the error. An integrity manager comprises a host component (e.g., software 116) and a device component (e.g., DMA engine 118). In one embodiment, a storage server includes the host component, the device component, and the integrity manager in a single chassis. A storage system may distribute the host, device, and integrity manager over more than one physical devices or chassis. For example, a host computer may be connected to a RAID (redundant array of independent/inexpensive disks) controller over a network, while the RAID controller is coupled to a memory over a system bus. In this example, the host computer would be the host component, and the RAID controller would be the device component, together forming a storage system.

Figure 1B:
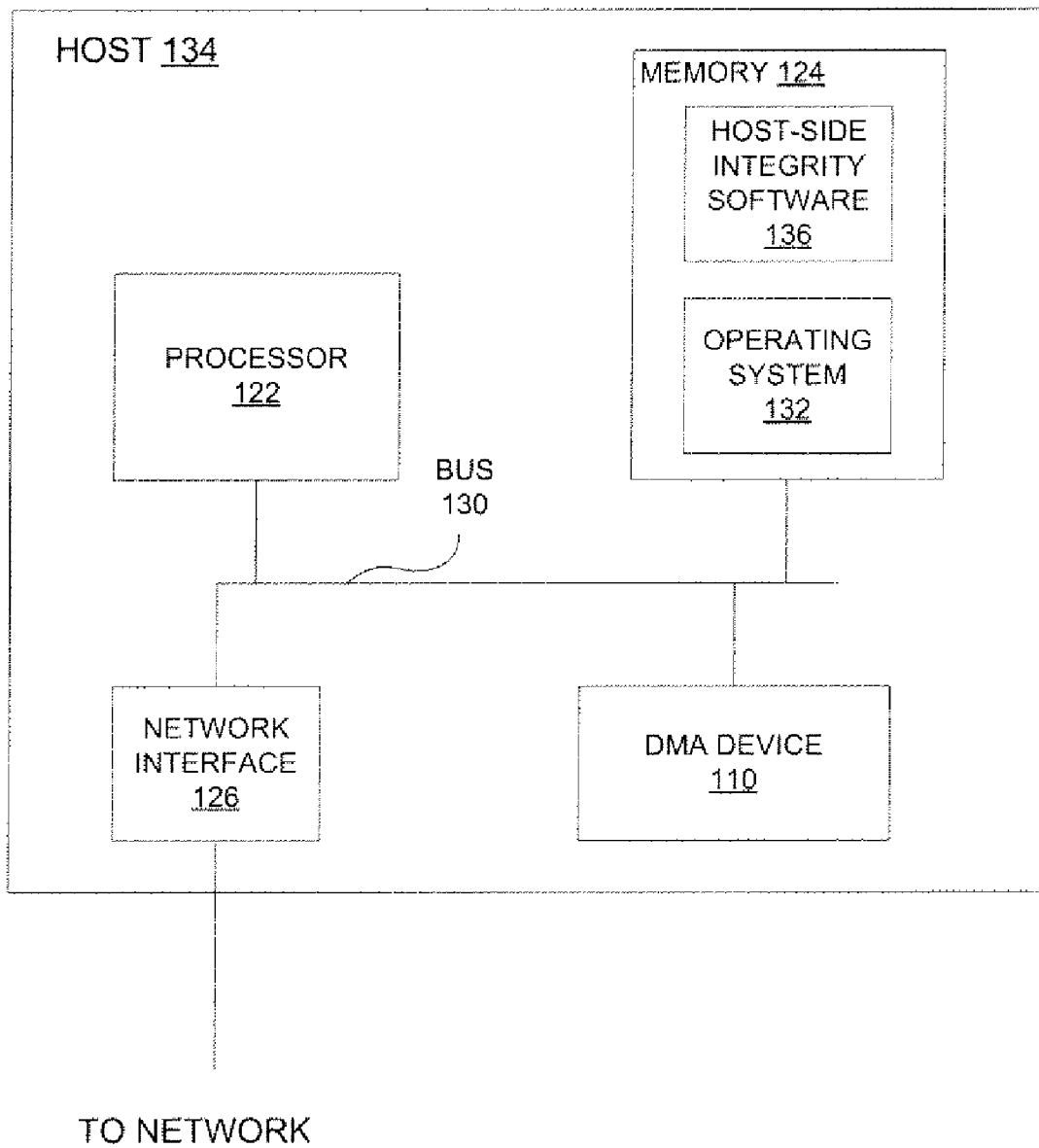
FIG. 1B is a diagram illustrating one embodiment of a data processing system as shown in FIG. 1A.

One embodiment of the software 116 may be performed on a system (e.g., a server) as illustrated in FIG. 1B. Referring to FIG. 1B, the host 134 includes a processor 122, a memory 124, a network interface 126, and DMA device 110, which bus system 130 couples together. The bus system 130 may include one or more buses and/or interconnects. The host 134 communicates with a network (e.g., the Internet) via the network interface 126, which can be an Ethernet adapter, fiber channel adapter, etc. The network interface 126 may be coupled to a public network, a private network, or a combination of both.

In one embodiment, the processor 122 reads instructions from the memory 124 and executes the instructions. The memory 124 may include any of various types of memory devices, such as, for example, random access memory (RAM), read-only memory (ROM), flash memory, one or more mass storage devices (e.g., disks), etc. The memory 124 stores instructions of an operating system 132 and host-side integrity software 136. The processor 122 may retrieve the instructions from the memory 124 to run the operating system 132 and software 136.

Figure 1C:
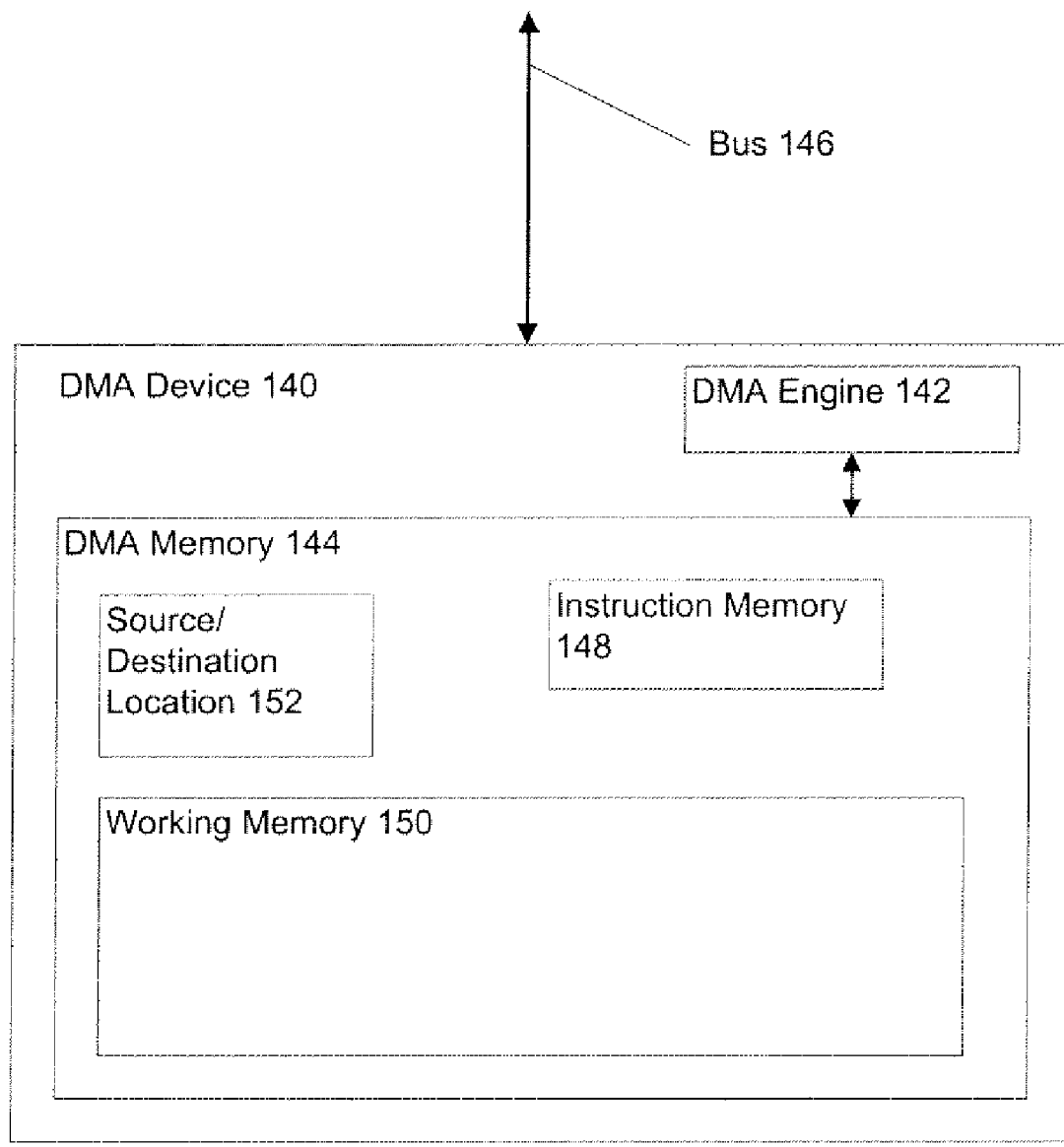
FIG. 1C is a diagram illustrating one embodiment of a DMA device as shown in FIG. 1A.

FIG. 1C illustrates one embodiment of a DMA device 110. DMA device 140 includes DMA engine 142 and DMA memory 144. DMA device 140 may be coupled to another system, such as host 100, through a bus 146. Engine 142 may be coupled to the DMA memory 144 through a memory channel. DMA memory 144 may include an instruction memory 148, working memory 150, and a source or destination location 152. Engine 142 may transfer data to or from location 152. In one embodiment, DMA engine 142 is implemented using a field-programmable gate array (FPGA). The instruction memory 148 may be a PROM (Programmable Read Only Memory) which configures the engine 142 with instructions at power-on. In another embodiment, memory 144 provides instructions to a processing unit in the engine which executes the instructions. A configured engine 142 may store DMA descriptors and CRC values in working memory 150.

Figure 2:
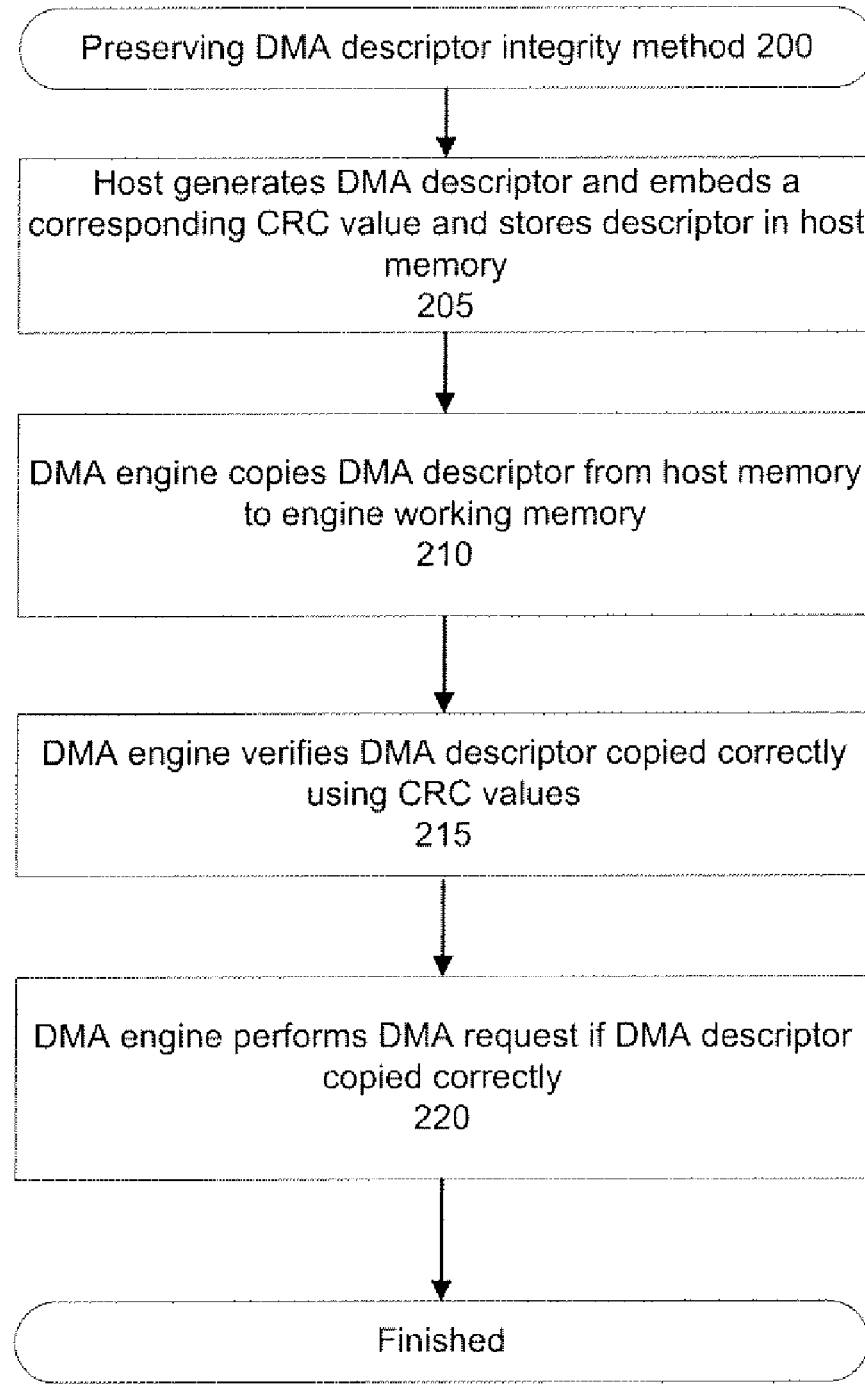
FIG. 2 illustrates a flowchart of a method to be performed by an integrity manager according to an embodiment of the invention.

FIG. 2 illustrates a method 200 to be performed by an integrity manager comprising a host component (e.g., software 116) and a device component (e.g., DMA engine 118) according to an embodiment of the invention. At block 205, host-side integrity software generates a DMA descriptor in response to a DMA request and embeds a corresponding CRC value in the host-side descriptor. The host software stores the DMA descriptor in a host memory. The CRC uniquely identifies the current state of the DMA descriptor in a manner well known in the art. At block 210, the DMA engine copies the DMA descriptor from the host memory to a working memory used by the DMA engine. In certain situations, software or hardware problems may corrupt the DMA descriptor while it resides in host memory or while the DMA engine transfers the descriptor over a bus.

At block 215, the DMA engine generates a new device-side CRC value using the contents of the descriptor in working memory and verifies whether the two CRC values match. The DMA engine uses the same CRC technique as the host software and excludes the portion of the descriptor storing the host-side CRC. Descriptor verification is described in greater detail below in conjunction with FIGS. 3A and 3B. At block 220, the DMA engine performs the DMA request specified by the DMA descriptor if the descriptor is intact. If the CRC computed by the DMA engine matches the CRC accompanying the descriptor, transferring the descriptor was successful, and the DMA engine may perform the DMA request specified by the device-side DMA descriptor.

Figure 3A:
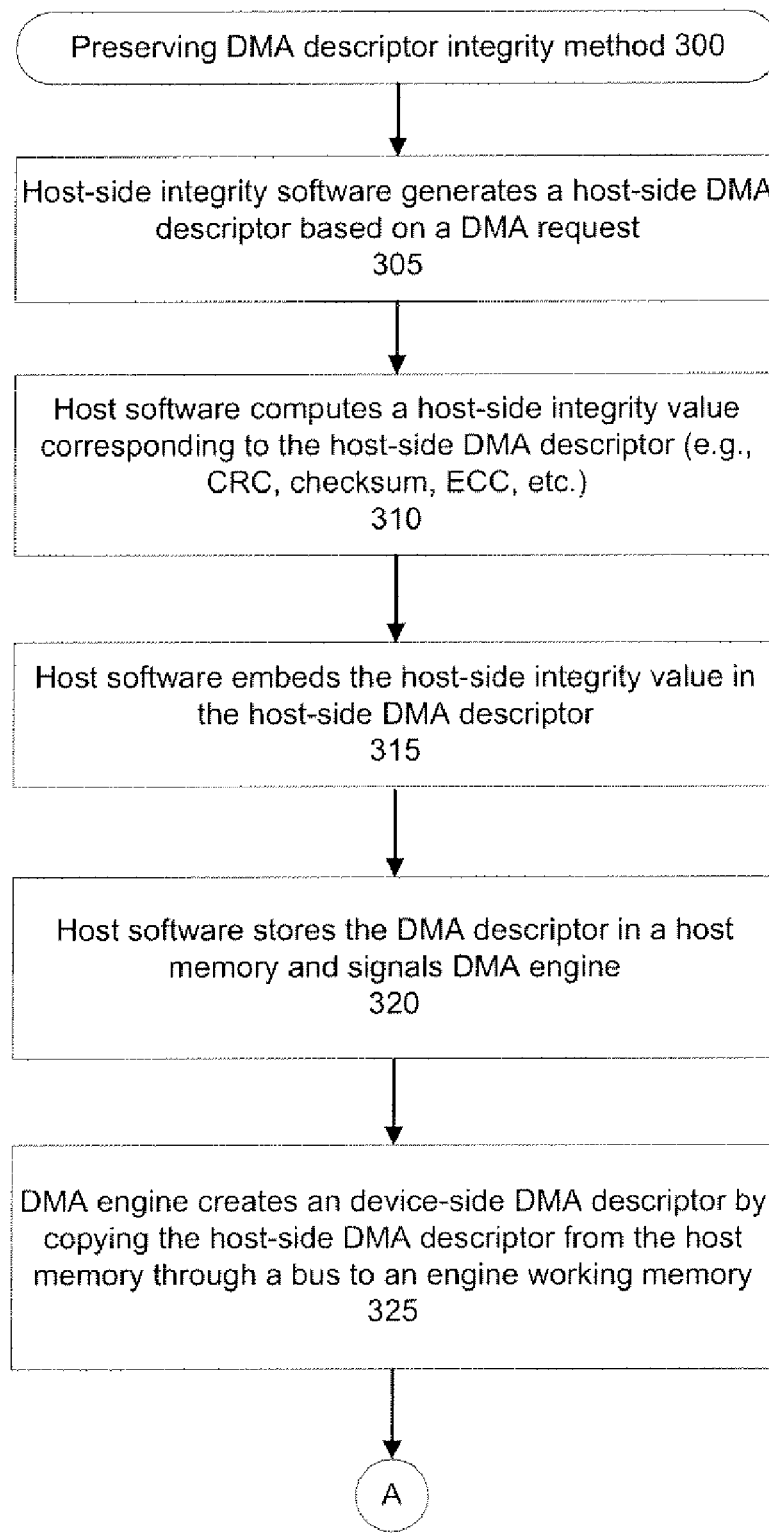
FIGS. 3A and 3B illustrate a flowchart of a method to be performed by an integrity manager according to an embodiment of the invention.
Figure 3B:
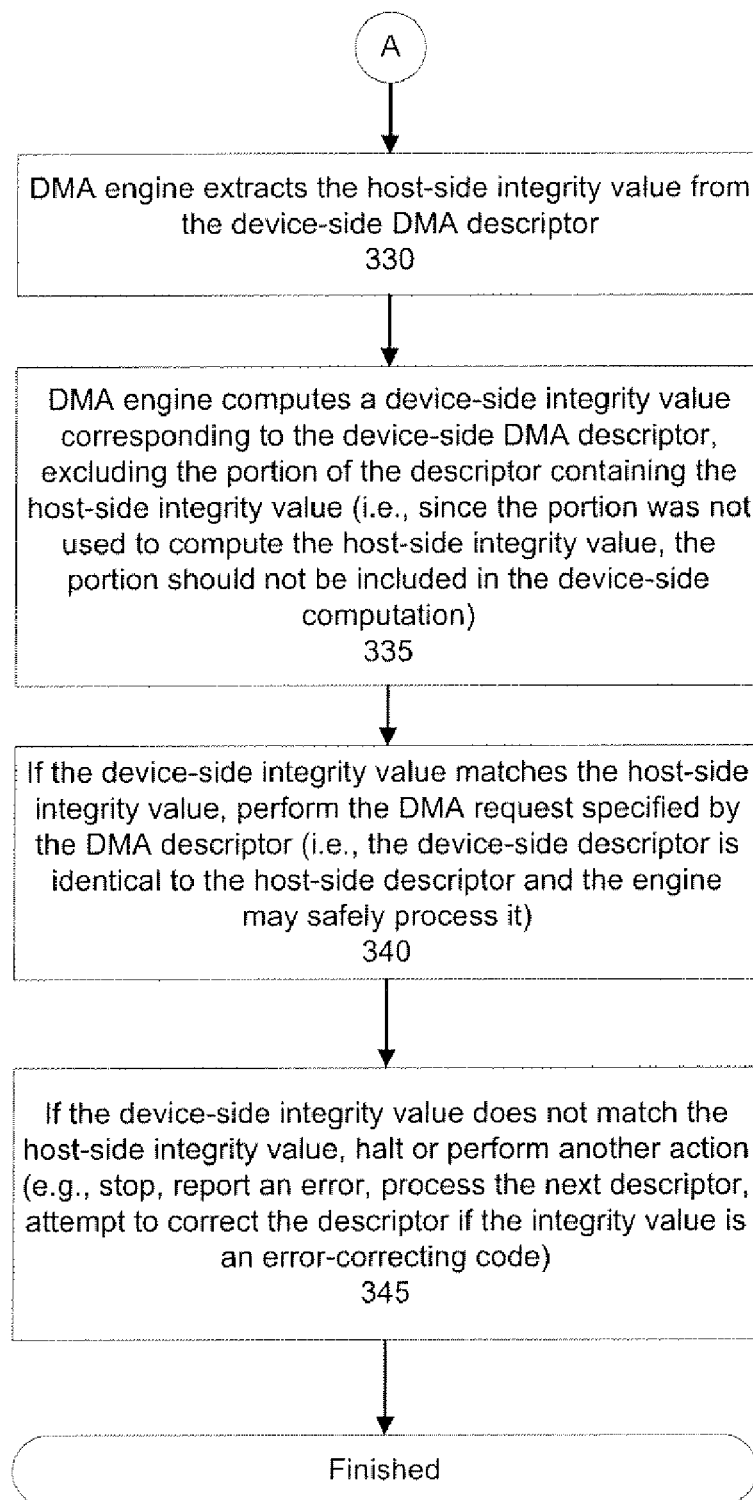

FIGS. 3A and 3B illustrate, in greater detail, a method 300 performed by an integrity manager comprising a host component (e.g., software 116) and a device component (e.g., engine 118) according to an embodiment of the invention. At block 305, host-side integrity software generates a host-side DMA descriptor in response to a DMA request, such as request 102 in FIG. 1A. The request specifies a data transfer operation in a manner well known in the art. The host software generates a host-side DMA descriptor according to the DMA request and stores the descriptor in host memory. The DMA descriptor specifies the DMA request in a format acceptable to the DMA engine in a manner well known in the art. At block 310, the host software computes a host-side integrity value corresponding to the host-side DMA descriptor. In one embodiment, the host software may use a CRC algorithm. In another embodiment, the host software may use a checksum algorithm. In yet another embodiment, the host software may use an error-correcting code algorithm. The host software may use other techniques known in the art to verify the integrity of the DMA descriptor. The host-side integrity value provides a unique identification of the current state of the host-side descriptor. In other words, if the data that makes up the host-side descriptor were to subsequently change, applying the same computation to the changed descriptor would produce a different integrity value.

At block 315, the host software embeds the host-side integrity value in the host-side descriptor. In one embodiment, the host software excludes the portion of the descriptor corresponding to the integrity value from the computation with a bit mask. At block 320, the host software stores the host-side descriptor in host memory and sends a signal to the DMA device indicating that a new descriptor requires processing. In one embodiment, a corruption detection interval begins after the host software stores the descriptor and corresponding CRC in host memory. A corruption detection interval is described below in conjunction with FIG. 4. At block 325, the DMA engine responds to the signal and transfers the host-side descriptor from host memory through the bus and stores the transferred data as the device-side DMA descriptor. Turning to FIG. 3B, at block 330, the DMA engine extracts the host-side integrity value from the device-side DMA descriptor. As described above, the host-side integrity value uniquely identifies the state of the DMA descriptor when the host software first stored it in host memory. At block 335, the DMA engine computes a device-side integrity value corresponding to the state of the device-side DMA descriptor. The computation may exclude the portion of the descriptor corresponding to the integrity value with a bit mask.

In one embodiment, since the host software stores the host-side integrity value in the host-side DMA descriptor, the value of the portion of the DMA descriptor used to store the host-side integrity value may be indeterminate or null at the time the host-side integrity value is computed. The host software may use a bitmask when computing the host-side integrity value to provide a consistent effective value (e.g., null) for this portion of the descriptor. In order for the DMA engine to compute an accurate device-side integrity value, the DMA engine performs the same operation (i.e., bitmask).

If, at block 340, the DMA engine determines that the host-side integrity value is consistent with the device-side integrity value, the DMA engine performs the DMA request specified by the descriptor. Since the values match, the descriptor is valid, and matches the host-side DMA descriptor. In one embodiment, the corruption detection interval provided by the CRC ends after the DMA engines performs the actions represented by block 340. Otherwise, if at block 345 the DMA engine determines that the integrity values do not match, the DMA engine does not perform the DMA request. In one embodiment, the DMA engine may halt and send an error to the host software. In another embodiment, the DMA engine may skip the current descriptor and process the next descriptor. In yet another embodiment, the DMA engine may attempt to transfer the host-side descriptor again and repeat the verification process. In still another embodiment, the verification technique may provide an error correction means, such as an error-correcting code (ECC). If the host-side integrity software uses ECC or another error correcting technique, the DMA engine may attempt to correct the errors in the device-side descriptor and then process the request if successful.

In one embodiment, the DMA engine computes a device-side payload integrity value for the data in the source location. (i.e., the source location of the data the DMA request identifies). The DMA engine embeds the device-side payload integrity value in another portion of the DMA descriptor and transfers the DMA descriptor back to host memory. Alternatively, the DMA engine may transfer the device-side payload integrity value separately. The host software, after receiving an indication that the DMA engine has transferred the requested data, computes a host-side payload integrity value of the data in the destination location specified by the DMA request. If the host-side payload integrity value matches the device-side payload integrity value, then the DMA engine successfully transferred the requested data.

In one embodiment, the DMA engine generates a device-side response DMA descriptor. The DMA engine transfers the response descriptor to the host software to generate a host-side response DMA descriptor. The response descriptor indicates to the host software that the operation specified by the initial DMA descriptor is complete. The response descriptor may also provide completion status information (e.g., completion information, error codes, status information, etc.). The DMA engine may signal to the host software with an interrupt indicating completion of the DMA command and availability of a DMA command completion descriptor.

The DMA engine may compute a device-side response integrity value corresponding to a device-side response DMA command completion descriptor (i.e., a descriptor containing completion information). The response integrity value may be computed using the techniques described elsewhere in conjunction with host-side DMA descriptors. The DMA engine embeds the device-side response integrity value in a portion of the response descriptor that is excluded from computation of the integrity value. The DMA engine may generate a host-side response DMA descriptor by transferring the device-side response DMA descriptor to a host memory through a bus coupled to the host memory. In another embodiment, the DMA engine stores the response descriptor in DMA engine working memory or DMA engine local memory, and the host software transfers the response descriptor itself in response to an interrupt from the DMA engine.

The host software may extract the device-side response integrity value from the host-side response DMA descriptor and then compute a host-side response integrity value using the same technique as the DMA engine. The host software may compare the host-side response integrity value and the device-side response integrity value to determine if the host-side response DMA descriptor is corrupted. In one embodiment, the integrity values are error correcting codes which the host software uses to repair a corrupted host-side response DMA descriptor. If the response descriptor is not corrupt, the host software may increase its reliance upon the contents of the completion information.

Figure 4:
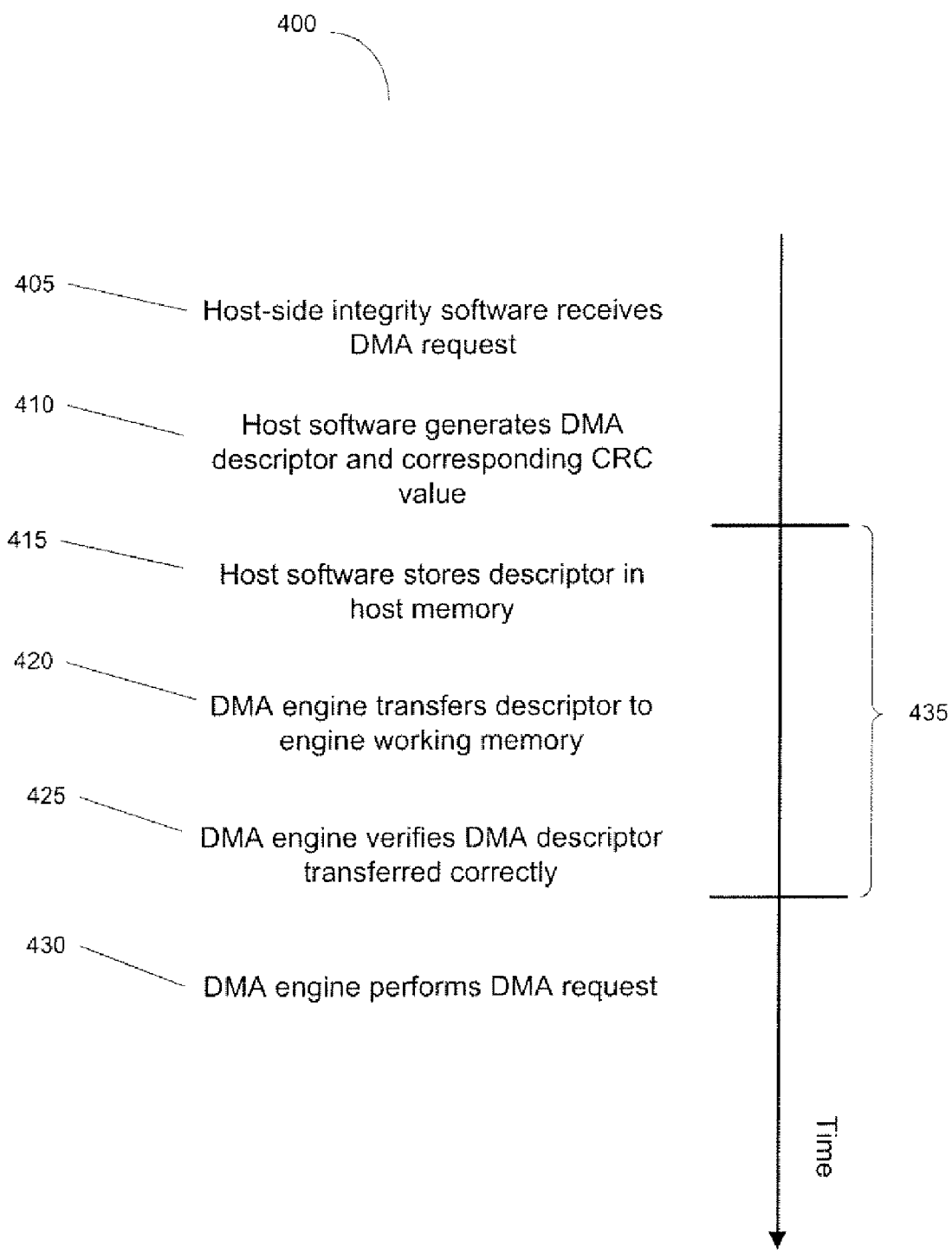
FIG. 4 is a timing diagram illustrating a corruption detection interval according to an embodiment of the invention.

Turning now to FIG. 4, the timing diagram 400 illustrates a corruption detection interval. Time advances in the downward direction. Host-side integrity software, such as software 116, receives a DMA request at time 405. At time 410, the software generates a DMA descriptor and CRC value as described above. At time 415, the software stores the descriptor in host memory along with the corresponding CRC value. At time 420, the DMA engine transfers the descriptor to working memory. At time 425, the DMA engine verifies the DMA descriptor transfer was successful. At time 430, the DMA engine performs the DMA request. Time period 435 indicates a time interval during which the DMA engine may detect corruption of the DMA descriptor. Time period 435 includes two components: elapsed time between the host storing the descriptor in host memory and the DMA engine retrieving the descriptor, and the transfer of the descriptor from host memory through the bus and into the working memory of the DMA engine. During time period 435, use of integrity values enhances the probability that the DMA engine will correctly identify a corrupted DMA descriptor before processing.

Figure 5:
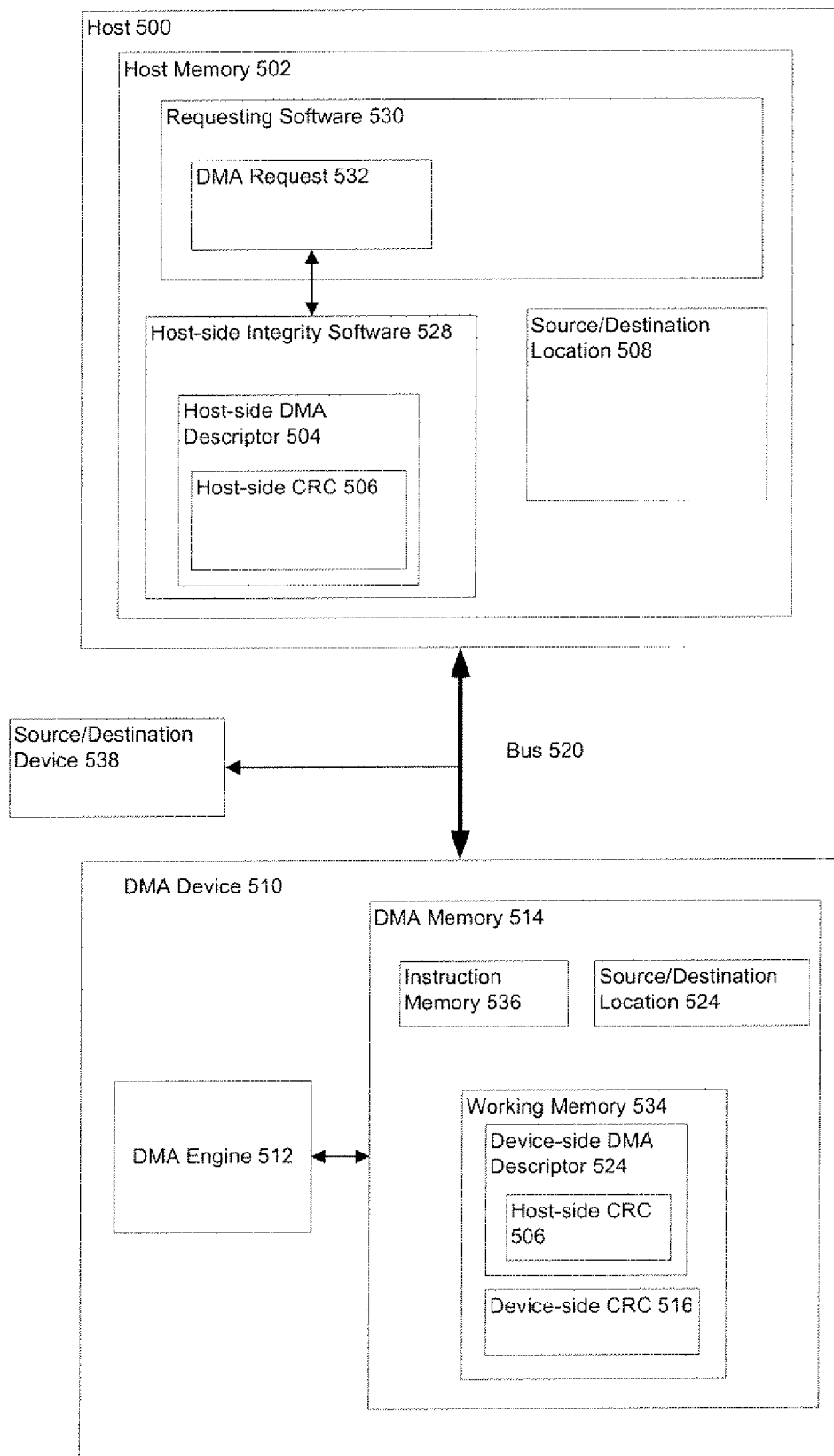
FIG. 5 is a diagram illustrating logical components of an integrity manager according to an embodiment of the invention.

FIG. 5 illustrates in further detail an embodiment of host 100 in FIG. 1A. Host 500 includes host memory 502 and is coupled to DMA device 510 and source/destination device 538 through bus 520. Source/destination device 538 may be the source or destination of a DMA data transfer, and may also generate a DMA request. Host memory 502 includes requesting software 530, host-side integrity software 528, and source/destination location 508. Instructions corresponding to requesting software 530 are executed by a host processor (not shown), which may generate DMA request 532. Software 530 sends DMA request 532 to software 528 for servicing. Software 528 generates host-side DMA descriptor 504 in response to DMA request 532. Software 528 also generates host-side CRC 506 in the manner described above. Location 508 may be the source or destination of a data transfer to or from host memory. Software 528 signals DMA device 510 that DMA descriptor 504 is available. In one embodiment, host-side integrity software 528 and DMA device 510 may be considered to be an integrity manager (not shown).

DMA device 510 includes DMA engine 512 and DMA memory 514. In response to the signal from software 528, DMA engine 512 transfers and stores a device-side DMA descriptor 524 and host-side CRC 506 in working memory 534. DMA engine 512 also generates a device-side CRC 516 corresponding to device-side DMA descriptor 534 and stores it in working memory. Instruction memory 536 configures DMA engine 512 when power is received by DMA device 510. Location 524 may be the source or destination location of a DMA request such as request 532.

In practice, the methods 200 and 300 may constitute one or more programs made up of computer-executable instructions. Describing the method with reference to the flowcharts in FIGS. 2, 3A, and 3B enables one skilled in the art to develop such programs, including such instructions to carry out the operations (acts) represented by logical blocks 200-220 and 300-345 on suitably configured computers (the processor of the computer executing the instructions from computer-readable media). The computer-executable instructions may be written in a computer programming language or may be embodied in firmware logic or in hardware circuitry. If written in a programming language conforming to a recognized standard, such instructions can be executed on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, process, application, module, logic . . . ), as taking an action or causing a result. Such expressions are merely a shorthand way of saying that execution of the software by a computer causes the processor of the computer to perform an action or produce a result. It will be further appreciated that more or fewer processes may be incorporated into the methods illustrated in FIGS. 2, 3A, and 3B without departing from the scope of the invention and that no particular order is implied by the arrangement of blocks shown and described herein.

An integrity manager comprising a host component (e.g., software 116 in FIG. 1A) and a device component (e.g., DMA engine 118 in FIG. 1A) has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention.

Moreover, the description of FIGS. 1A-B is intended to provide an overview of computer hardware and other operating components suitable for performing the methods of the invention described above, but is not intended to limit the applicable environments. One of skill in the art will immediately appreciate that the invention can be practiced with other computer system configurations. The invention can also be practiced in distributed computing environments where tasks are performed by remote processing devices that are linked through a communications network.

It will be readily apparent to one of skill, that input/output devices, such as a keyboard, a pointing device, a network interface, and a display, may be coupled to the integrity manager. These conventional features have not been illustrated for sake of clarity.

The term "memory" as used herein is intended to encompass all volatile storage media, such as dynamic random access memory (DRAM), static RAM (SRAM); non-volatile memory such as battery backed DRAM, battery backed SRAM, or Flash. Computer-executable instructions can be stored on non-volatile storage devices, such as magnetic hard disk, an optical disk, and are typically written, by a direct memory access process, into memory during execution of software by a processor. One of skill in the art will immediately recognize that the term "computer-readable storage medium" includes any type of volatile or non-volatile storage device that is accessible by a processor.

Therefore, it is manifestly intended that this invention be limited only by the following claims and equivalents thereof.

What is claimed is:

1. A computerized method comprising:
    computing, by a host component, a host-side integrity value corresponding to a host-side DMA (direct memory access) descriptor, wherein a portion of the host-side DMA descriptor is excluded from the computing;
    embedding, by the host component, the host-side integrity value in the portion of the host-side DMA descriptor;
    storing, by the host component, the host-side DMA descriptor in a host memory;
    generating, by a device component, a device-side DMA descriptor by copying the host-side DMA descriptor from the host memory through a bus coupled between the host computer and the device;
    extracting, by the device component, the host-side integrity value from the device-side DMA descriptor; and
    computing, by the device component, a device-side integrity value corresponding to the device-side DMA descriptor, wherein the portion of the device-side DMA descriptor storing the host-side integrity value is excluded from computing the device-side integrity value and wherein the device component compares the device-side integrity value to the host-side integrity value to determine if the device-side DMA descriptor is corrupted.

2. The computerized method of claim 1, wherein computing a host-side integrity value comprises computing a CRC ("Cyclic Redundancy Check.")

3. The computerized method of claim 1, wherein computing a host-side integrity value comprises computing a checksum value.

4. The computerized method of claim 1, wherein computing a host-side integrity value comprises computing an error-correcting code for correcting errors in the device-side DMA descriptor.

5. The computerized method of claim 1, further comprising:
    computing, by the device component, a device-side payload integrity value corresponding to a set of data from a source location;
    copying, by the device component, the set of data from the source location to a destination location;
    transferring, by the device component, the device-side payload integrity value and the device-side DMA descriptor to the host memory through the bus;
    computing, by the host component, a host-side payload integrity value corresponding to the set of data copied to the destination location; and
    indicating, by the host component, a successful copy if the device-side payload integrity value matches the host-side integrity value.

6. The computerized method of claim 1, further comprising:
    computing, by the device component, a device-side response integrity value corresponding to a device-side response DMA descriptor;
    embedding, by the device component, the device-side response integrity value in the portion of the device-side response DMA descriptor;
    generating, by the device component, a host-side response DMA descriptor by transferring the device-side response DMA descriptor to the host memory through a bus coupled to the host memory;
    extracting, by the host component, the device-side response integrity value from the host-side response DMA descriptor; and
    computing, by the host component, a host-side response integrity value corresponding to the host-side response DMA descriptor, wherein the portion of the host-side response DMA descriptor storing the device-side response integrity value is excluded from computing the host-side response integrity value and wherein the host component compares the device-side response integrity value to the host-side response integrity value to determine if the host-side response DMA descriptor is corrupted.

7. A system comprising:
a host processor coupled to a bus;
a host memory coupled to the host processor through the bus;
a DMA (direct memory access) engine coupled to the bus and further coupled to a device memory, the device memory comprising an instructions memory and a working memory;

instructions executed by the host processor from the host memory to cause the host processor to:
    compute a host-side integrity value corresponding to a host-side DMA descriptor, wherein a portion of the host-side DMA descriptor is excluded from the computing,
    embed the host-side integrity value in the portion of the host-side DMA descriptor, and
    store the host-side DMA descriptor in the host memory; and
instructions executed by the DMA engine from the instructions memory to cause the DMA engine to:
    generate a device-side DMA descriptor by copying the host-side DMA descriptor from the host memory to the working memory,
    extract the host-side integrity value from the device-side DMA descriptor,
    compute a device-side integrity value corresponding to the device-side DMA descriptor, wherein the portion of the device-side DMA descriptor storing the host-side integrity value is excluded from computing the device-side integrity value and wherein the DMA engine compares the device-side integrity value to the host-side integrity value to determine if the device-side DMA descriptor is corrupted.

8. The system of claim 7, wherein computing a host-side integrity value comprises computing a CRC ("Cyclic Redundancy Check.")

9. The system of claim 7, wherein computing a host-side integrity value comprises computing a checksum value.

10. The system of claim 7, wherein computing a host-side integrity value comprises computing an error-correcting code.

11. The system of claim 7, wherein the instructions executed by the DMA engine further comprise:
    compute a device-side payload integrity value corresponding to a set of data from a source location,
    copy the set of data from the source location to a destination location,
    transfer the device-side payload integrity value and the device-side DMA descriptor to the host memory through the bus;
    and wherein the instructions executed by the host processor further comprise:
        compute a host-side payload integrity value corresponding to the set of data copied to the destination location, and
        indicate a successful copy if the device-side payload integrity value matches the host-side integrity value.

12. The system of claim 7, wherein the instructions executed by the DMA engine further comprise:
    compute a device-side response integrity value corresponding to a device-side response DMA descriptor,
    embed the device-side response integrity value in the portion of the device-side response DMA descriptor,
    generate a host-side response DMA descriptor by transferring the device-side response DMA descriptor to the host memory through a bus coupled to the host memory;
    and wherein the instructions executed by the host processor further comprise:
        extract the device-side response integrity value from the host-side response DMA descriptor; and
        compute a host-side response integrity value corresponding to the host-side response DMA descriptor, wherein the portion of the host-side response DMA descriptor storing the device-side response integrity value is excluded from computing the host-side response integrity value and wherein the host processor compares the device-side response integrity value to the host-side response integrity value to determine if the host-side response DMA descriptor is corrupted.

13. A storage system comprising:

a host computer;

a device coupled to the host computer to transfer a DMA (direct memory access) descriptor between the host computer and the device using an integrity manager, the integrity manager comprising:

instructions executed by the host computer to cause the host computer to embed a host-side DMA descriptor integrity value in the DMA descriptor;

instructions executed by the device to cause the device to transfer the DMA descriptor to a device memory, to generate a device-side DMA descriptor integrity value, and to compare the device-side integrity value to the host-side DMA descriptor integrity value to determine if the DMA descriptor is corrupted.

14. The storage system of claim 13, wherein the host-side DMA descriptor integrity value comprises a CRC (cyclic redundancy check.)

15. The storage system of claim 13, wherein the host-side DMA descriptor integrity value comprises a checksum value.

16. The storage system of claim 13, wherein the host-side DMA descriptor integrity value comprises an error-correcting code.

* * * * *